United States Patent [19]

Mihara

[11] Patent Number: 4,836,025
[45] Date of Patent: Jun. 6, 1989

[54] ACCELEROMETER

[75] Inventor: Teruyoshi Mihara, Yokosuka, Japan

[73] Assignee: Nissan Motor Co., Ltd., Yokohama, Japan

[21] Appl. No.: 25,713

[22] Filed: Mar. 13, 1987

[30] Foreign Application Priority Data

Mar. 14, 1986 [JP] Japan ............................ 61-54974

[51] Int. Cl.⁴ .............................................. G01P 15/12
[52] U.S. Cl. .................................... 73/517 R; 73/497; 338/3
[58] Field of Search ...................... 73/517 R, 766, 497, 73/862.63; 338/3, 5, 46, 47

[56] References Cited

U.S. PATENT DOCUMENTS 4,522,072  6/1985  Sulouff et al. .................... 73/517 R
4,553,436 11/1985  Hansson ........................... 73/517 R

FOREIGN PATENT DOCUMENTS 60-55655  3/1985  Japan .
61-97572  5/1986  Japan .
1534276  11/1978  United Kingdom ................ 338/5

OTHER PUBLICATIONS

L. M. Roylance et al., "A Batch-Fabricated Silicon Accelerometer," *IEEE Transactions on Electron Devices*, vol. ED-26, No. 12 (Dec. 1979), pp. 1911–1917.

Primary Examiner—John Chapman
Attorney, Agent, or Firm—Foley & Lardner, Schwartz, Jeffery, Schwaab, Mack, Blumenthal & Evans

[57] ABSTRACT

First and second piezo resistances are disposed on a flexible member which supports a mass member on a semiconductor base and are arranged to be responsive to the amount of flexure thereof. The flexible member has a predetermined uniform thickness. Second and third piezo resistances are arranged on a separate compensation member which projects from the base. This member is subject to essentially no flexure and has exactly the same uniform thickness as the flexible one. The four piezo resistances are connected to define a bridge circuit the output of which is indicative of the force which induces the flexure of the flexible member.

8 Claims, 4 Drawing Sheets

ACCELEROMETER

BACKGROUND OF THE INVENTION

1. Field of the Invention

The present invention relates generally to a semiconductor type accelerometer and more specifically to such a type of sensor which utilizes a piezo resistance effect to determine the amount of G force being applied to a movable mass member or element thereof.

2. Description of the Prior Art

FIGS. 1 and 2 show a prior art semiconductor accelerometer disclosed in IEEE Electron Devices, Vol.ED-26, No. 12 P1911, Dec. 1979 "A Batch Fabricated Silicon Accelerometer". As shown this device consists of a monocrystalline silicon wafer or base member 1 in which an essentially rectangular shaped cut-out 2 is formed. This cut-out defines an essentially rectangular section 3 which is connected to the remainder of the base member through a bridge-like portion 4. The lower face of the base member 1 is recessed in a manner which reduces the thickness of the "bridge" portion 4 and thus renders it relatively flexible. With this configuration the rectangular section 3 defined within the cut out is able to act as a pendulum or a mass member which is responsive to the G forces applied thereto when the device is subject to acceleration.

Four pizeo resistances 5a–5d are formed in the upper surface of the base member 1. Each of these resistances are defined by P type regions. Three heavily doped P+ regions 6–8 are formed in a manner as illustrated and act as leads for establishing electrical contact between the resistances and circuitry external of the chip.

The chip is disposed within a glass package which is filled with a suitable liquid or gaseous damping fluid.

When a G force is applied to the bridge portion 4 the piezo resistances 5a, 5b formed thereon are subject to flexure. This causes the resistance values of the same to vary. By connecting the reistances in a manner to define bridge circuit and measuring either the change in voltage or current flow which is induced by the change in resistance, the amount of force (acceleration) to which the mass member is subject can be measured.

However, with this type of arrangement a drawback has been encountered in that as the surface on which the piezo resistances 5a–5d are formed is uncovered, electrical leakage tends to occur and reduces the stability with which measurement can be effected.

In order to overcome this problem it has been proposed to form a SiO2 membrane (not shown) over the surface of the chip using a planar technique. This, while obviating the leakage problem has induced a further drawback in that as the expansion coefficients of the monocrystalline silicon wafer 1 and the SiO2 membrane are different, differences in the thickness of the Si and SiO2 layers in which the "measuring" and "reference" piezo resistances 5a, 5b & 5c, 5d are respectively formed, induces the situation wherein the temperature variation with respect to the amount of flexure is different and causes a difference in temperature drift which interferes with the accuracy of the device.

SUMMARY OF THE INVENTION

It is an object of the present invention to provide an acceleration sensor which exhibits temperature compensation characteristics which enable precise acceleration detection.

In brief, the above mentioned object is achieved by a semiconductor accelerometer arrangement wherein, in order to avoid a difference in temperature drift caused by the difference in expansion coefficients of a semiconductive substrate and an insulating oxide layer formed thereover, the piezo reistances which measure the movement of a mass member responsive the application of G forces and the piezo reistances which serve as references are respectively located on separate sections or portions of the semiconductor having the same uniform thickness. The piezo resistances are connected in a manner to define a bridge circuit the output of which varies with the amount of flexure of the section on which the measuring resistances are formed.

More specifically, the present invention takes the form of an accelerometer which is characterized by: a body formed of a semiconductive material; a mass element; a bridge portion interconnecting the body and the mass element, the bridge portion having a predetermined thickness; a portion extending from the body, the portion having a thickness essentially the same as that of the bridge portion; first and second piezo resistances formed in the bridge portion and arranged to be subject to strain when a force is applied to the mass element in a manner which causes the bridge portion to flex; third and fourth piezo resistances formed in the portion; and means for establishing electrical connection between the first, second, third and fourth piezo resistances and defining a circuit which generates an output signal indicative of the amount of force applied to the mass element.

DETAILED DESCRIPTION OF THE PREFERRED EMBODIMENT

Figure 1:
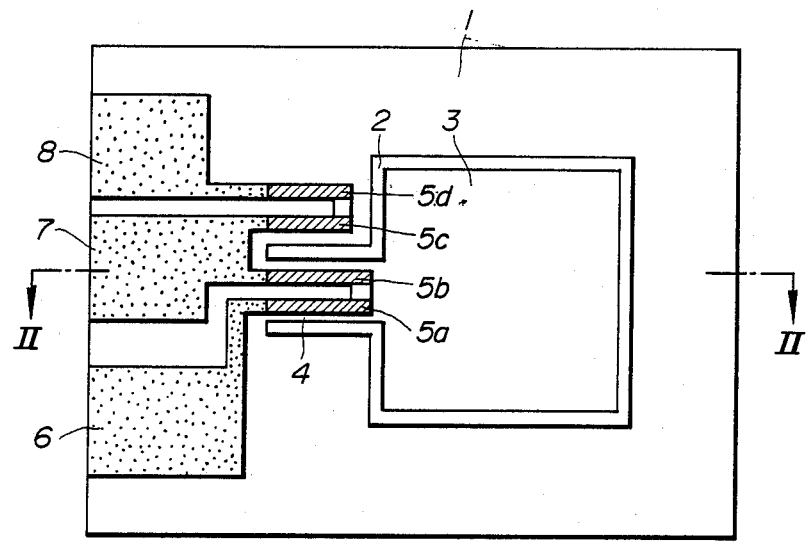
FIGS. 1 and 2 show the prior art arrangement discussed briefly in the opening paragraphs of the instant disclosure.
Figure 2:
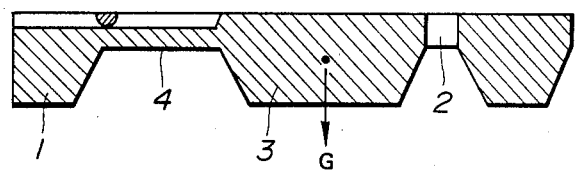
Figure 3:
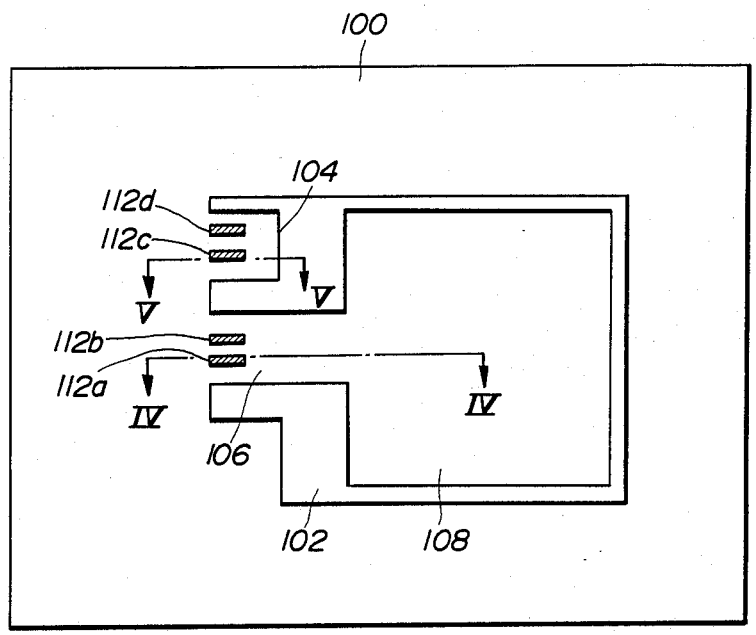
FIG. 3 is a plan view of an embodiment of the present invention.
Figure 4:
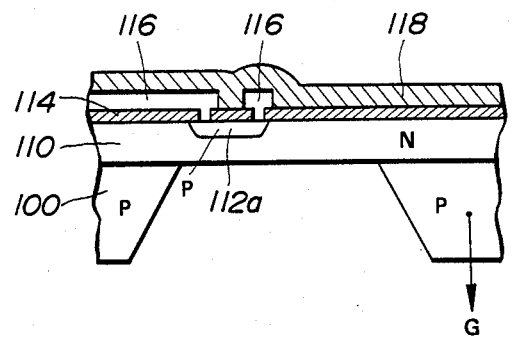
FIGS. 4 and 5 are sectional views taken along section lines IV—IV and V—V of FIG. 3.
Figure 5:
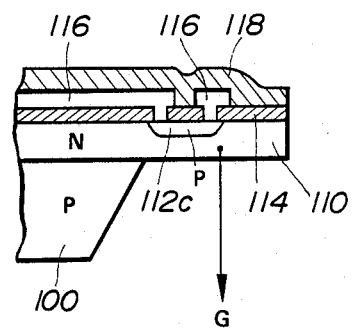
Figure 6:
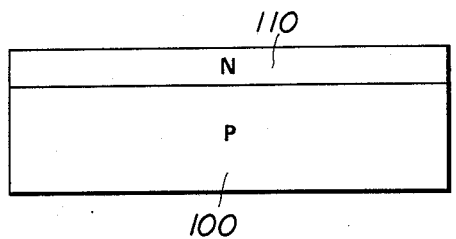
FIGS. 6 to 12 show the various stages involved in the fabrication of the arrangement shown in FIGS. 3 to 5.
Figure 7:
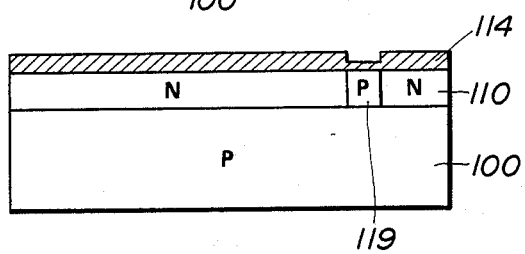
Figure 8:
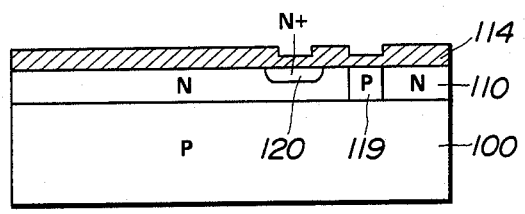

FIGS. 3 to 5 shows an embodiment of the present invention. In this arrangement a cut-out 102 is formed to have a shape basically similar to that of the prior art arrangement shown in FIGS. 1 and 2. However, in this case the configuration is such as to define a tongue-like temperature compensation portion or section 104 which projects in a direction essentially parallel to a bridge section 106 which suspends the movable mass member 108 on the base body proper 100. The temperature compensation section 104 is arranged to have thickness which is essentially identical to that of the bridge portion 106. The importance of this feature will become apparent hereinlater.

The upper surface of the monocrystalline P type wafer is formed with a N type epitaxial layer 110 in which piezo reistances 112a, 112b are defined by P type doped regions. Corresponding piezo resistances 112c, 112d are formed in the temperature compensation portion 104. The piezo resistances 112a, 112b formed on the "flexible" bridge section 106 are, due to their disposition, responsive to the flexure of said section and thus sensitive to the the application of G forces to the mass member 108. Due to the negligible flexure of the temperature correction section 104 the piezo elements 112c, 112d formed thereof exhibit extremely low sensitivity to the gravitational forces (G).

An insulating SiO2 membrane 114 is formed over the top of the resistances and the upper surface of the epitaxial layer 110. On top of this layer connection electrodes 116 are formed to establish suitable electrical connection between each of the piezo resistances 112a-112d and enable the formation of a bridge circuit of the nature shown in FIG. 13.

A PSG (phosphosilicate glass) layer 118 is formed over the upper surface of the device in a manner as shown.

The above described sensor is formed using the following steps.

(1) A P type base member or wafer 100 having a crystallographic face (100), a relative resistance of approximately 5Ω.cm and a thickness of about 400 μm is prepared and an N type epitaxial layer 110 having relative resistance of about 10 Ω.cm and a thickness in the order of 10 μm subsequently formed thereon. It will be noted that the thickness of this epitaxial layer 110 is varied in accordance with the desired sensitivity of the sensor.

(2) Utilizing a thermal oxidation process a SiO2 layer 114 is formed over the upper surface of the epitaxial layer 110. This layer 114 is modified to define a mask via which the doping of a relatively large P type region 119 is enabled. This region 119 is later removed to define the essentially retangular cut-out 102 which defines the mass member 108 and temperature correction portion 104.

(3) All of a plurality of n+ type regions 120 which define junctions used hereinlater to interconnect the epitaxial layer 110 and latter fabricated connection electrodes 116 and which are utilized in a latter described electrochemical etching process, are formed in the epitaxial layer 110 using a masking and doping technique similar to that mentioned above.

Figure 9:
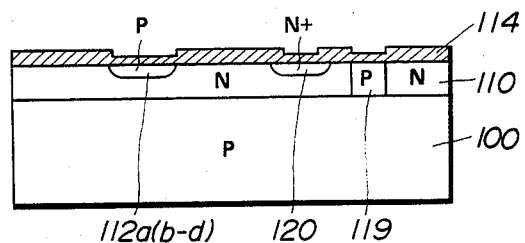
Figure 10:
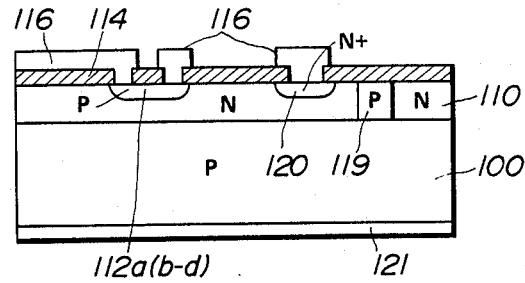

(4) Subsequently, as shown in FIG. 9, piezo resistances 112a to 112d are formed in the epitaxial layer 110 by doping selected sites. The regions formed during this process contain a concentration of approximately $1 \times 10^{18}$ cm$^{-3}$ of a selected P type impurity. It should be noted that the strain characteristics of the piezo resistances 112a, 112b are dependent of the concentration of the doping impurity and that the sensitivity of the reistances is high when the concentration of the impurity is low. Accordingly, care must be taken during this step to ensure tat the appropriate amount of impregnation is uniformly achieved.

(5) Next, a second SiO2 layer 121 about 1 μm thick is formed on the lower surface of the wafer and subsequently modified in readiness for electrochemical etching. During this stage connection electrodes 116 are formed on the upper surface of the SiO2 layer 114 in a manner to enable selective electrical connection of the piezo resistances 112a-112d and the epitaxial layer 110 with circuitry external of the finished chip.

Figure 11:
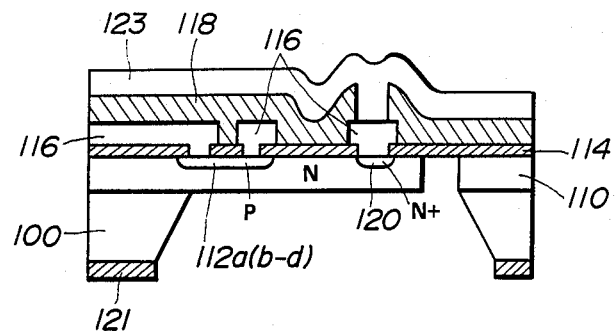

(6) Following this, the insulating membrane 118 of PSG (phosphosilicate glass) approximately 7000 Å thick and a temporary electrochemical etching electrode 123 are formed in a manner as shown in FIG. 11. As will be noted the etching electrode 123 is arranged to establish electric contact only with the connection electrode(s) 116 which is associated with the n+ regions 120.

Subsequently, the wafer is immersed in an alkali etching solution of aqueous solution of potassium hydroxide or a mixture of water and a suitable organic reagent and subject to electrochemical etching wherein the etching electrode is used as the anode and a platinum electrode used as the cathode. P type material is removed from the lower surface of the wafer until the situation shown in FIG. 11 is reached. As the etching electrode is used as the anode the etching process terminates at the PN interface and enables precise control of the thickness of the bridge and temperature compensation portions 106, 104.

Figure 12:
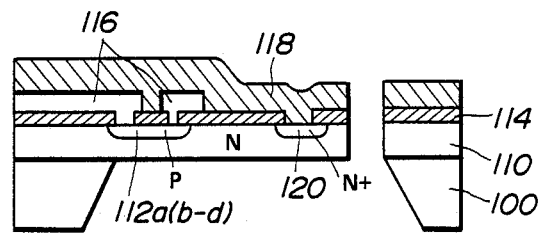

(7) The final stage(s) of the fabrication results in the arrangement shown in FIG. 12 and involves the removal of the temporary etching electrode 123, the contact electrode(s) 116 which is associated with the n+ regions 120, the filling of the gap(s) left after the removal of the just mentioned contact electrode(s) 116 with PSG, the removal of the portion of the SiO2 layer 114 which is located above the now empty space previously occupied by the P region 119, and the removal of the portion of the PSG layer 118 located thereabove.

With this arrangement when a G force is applied to the mass member 108 of the device and the bridge portion 106 subject to flexure the values of piezo resistances 112a and 112b change increasing the value of the potential Vo developed across the bridge circuit. This potential is indicative of the force applied to the mass member 108.

Figure 14:
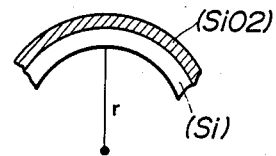
FIG. 14 is a sketch illustrating (in a slightly exaggerated manner) the radius of curvature which is produced during the operation of the embodiment of the present invention.

FIG. 14 of the drawings shows a sectional view of a portion of the bridge section when the latter is subject to flexure. As will be appreciated the curvature of this drawing is exaggerated in order to facilitate illustration and explantion. Due to the difference in expansion coefficients of silicon (Si) and silicon oxide (SiO2), the bridge portion 106 can be looked upon as defining a system analogous to a bimetal strip and represented by the following equation.

$$r = 1/\delta(\alpha 1 - \alpha 2) \cdot \Delta T \times (E1/E2) \times (d1^2/d2) \quad (1)$$

wherein:

r—is the radius of curvature;
δ—is a constant;
α1—is the expansion coefficient of Si (approx $2.4 \times 10^{-6}/°C$.);
α2—is the expansion coefficient of SiO2 (approx $0.4 \times 10^{-8}/°C$.);
E1—is the Youngs Modulus of Si (approx $1.9 \times 10^{12}$ dyne/cm$^2$);
E2—is the Youngs Modulus of SiO2 (approx $0.7 \times 10^{12}$ dyne/cm$^2$);
d1—is the thickness of the Si layer;
d2—is the thickness of the SiO2 layer; and
ΔT—is the temperature differential between the Si and SiO2 layers.

As will be clear from the above equation (1) in connection with the temperature change induced by the flexure of the bridge portion 106, the main constructional influences thereon are limited to the dimensions taken in the direction of the thickness of the bridge portion and that the length and width of the same are irrelevant.

Figure 13:
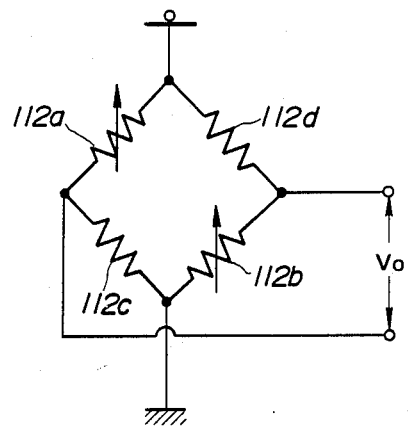
FIG. 13 shows a bridge circuit utilized in the embodiment of the present invention.

Now, as the thickness of the bridge portion 106 can be accurately controlled using the fabrication technique outlined above and both the "measuring" and "reference" piezo resistances (112a, 112b & 112c, 112d) are formed on members which have the same thickness (it being noted that the temperature correction section 104 is essentially uneffected by the G force acting on the mass member and that the radius of curvature thereof is essentially infinity), it is possible by interconnecting piezo resistances 112a, 112b on the bridge portion 106 with piezo reistances 112c, 112d on the temperature compensation portion, in a manner as shown in FIG. 13, to compensate for and thus negate any infuence which may be produced by changes in temperature and therefore enable highly accurate measurement of the G force acting on the mass member 108.

Further, as the voltage Vo produced by the bridge circuit shows good correlation with the G force applied to the mass element 108 it is possible for the piezo resistances formed in the temperature correction portion 104 to exhibit relatively low sensitivity and to be formed relatively long and wide without any adverse effect on the accuracy of the device. Viz., it is not necessary to exercise excessive precision in connection with the fabrication of the same.

What is claimed is:

1. In an accelerometer:
   a body formed of a semiconductive material;
   means defining an aperture in said body;
   first and second tongue-like portions extending from said body into said aperture, said first and second portions having the same thickness, said thickness being less than the thickness of said body;
   a mass formed at the end of said first portion;
   strain measuring piezo resistance formed on said first portion, said piezo resistances being subject to strain when said accelerometer is subject to an accelerative force which acts on said mass element and causes said first portion to flex; and
   temperature compensating piezo resistances formed on said second portion, said temperature compensating resistances being free from strain when said strain measuring resistances are flexed by said accelerative force.

2. An accelerometer comprising:
   a body formed of a semiconductive material;
   a mass element;
   a bridge portion which connects said body and said mass element, said bridge portion having a predetermined thickness, which thickness is less than the thickness of said body;
   a reference beam portion extending from said body, said portion having a tongue-like configuration of a thickness essentially the same as that of said bridge portion, said reference beam portion undergoing essentially no of strain when said bridge portion undergoes strain due to an accelerative force being applied to said mass element;
   piezo resistance measuring means formed in said bridge portion for measuring strain produced when a force is applied to the mass element in a manner which causes the bridge portion to flex;
   piezo resistance reference means formed in said reference beam portion, said reference means not undergoing strain when said measuring piezo resistance is subject to strain; and
   circuit means connecting said measuring and reference means and generating an output signal indicative of the amount of accelerative force applied to said mass element.

3. An accelerometer comprising:
   a body formed of a semiconductive material, said body comprising a base section of a first semiconductor type material and an epitaxial layer on the upper surface thereof, said epitaxial layer formed of a second type of semiconductive material and having an essentially uniform thickness;
   a mass element;
   a bridge portion interconnecting said body and said mass element, said bridge portion having a predetermined thickness;
   a second portion extending from said body, said second portion having a thickness essentially the same as that of said bridge portion;
   a strain measuring resistance formed in said bridge portion, said bridge portion subject to strain when an acceleration force applied to said mass element causes said bridge portion to flex, said strain measuring resistance undergoing a change in electrical properties when subject to strain and having a predetermined temperature characteristic;
   a temperature reference resistance formed in said second portion, said second portion undergoing essentially no strain when said strain measuring resistance is subject to strain, said temperature reference resistance having essentially the same temperature response characteristic as said measuring resistance;
   said measuring resistance and said reference resistance formed in said epitaxial layer;
   an insulating layer formed on the surface of the epitaxial layer, said insulating layer covering said strain measuring and temperature reference resistances and extending over both said bridge portion and said second portion;
   a portion of reduced thickness in said base portion extending from the lower surface of said base member to said epitaxial layer; and
   means for compensating for the effect of temperature on the response characteristics of said measuring resistance by using the effect of temperature on the response characteristics of said reference resistance.

4. An accelerometer as claimed in claim 3, further comprising:
   electrodes formed on the surface of said insulating layer, said electrodes forming part of an electrical circuit means, said electrical circuit means defining a bridge circuit which varies in output with the change in resistance of said strain measuring resistance; and
   a second insulating layer formed over the surface of said electrodes and said first insulating layer.

5. An accelerometer as claimed in claim 3, wherein the portion on which said temperature compensating resistances are positioned extends from said body in essential parallelism with said bridge portion.

6. In an accelerometer:
   a mass member;
   a bridge-like beam member, said bridge-like beam member interconnecting said body and said mass member, said bridge-like beam member undergoing flexure when a force is applied to said member;
   a measuring resistance on said bridge-like beam member, said measuring resistance changing in electrical properties when subject to strain and having a predetermined temperature response characteristic;

a reference resistance, said reference resistance positioned on a predetermined portion of said body of essentially the same thickness as said bridge-like beam portion, which undergoes essentially no strain when said measuring resistance is subject to strain, said reference resistance having the same predetermined temperature response characteristic as said measuring resistance, wherein said predetermined portion of said body is a tongue-like projection; and a circuit operatively interconnecting said measuring and reference resistances.

7. The accelerometer of claim 6, further including an aperture in said body, said mass member located in said aperture, and said bridge-like beam portion extending through said aperture to said mass member, said predetermined portion extending into said aperture at a location adjacent said bridge-like beam portion.

8. In an accelerometer:

a body formed of a semiconductive material;

means defining an aperture in said body;

first and second tongue-like portions extending from said body into said aperture, said first and second portions having the same thickness, said thickness being less than the thickness of said body;

a mass formed at the end of said first portion;

a strain measuring piezo resistance formed on said first portion, said strain measuring piezo resistance being subject to strain when said accelerometer is subject to an accelerative force which acts on said mass element and causes said first portion to flex; and a temperature compensating piezo resistance formed on said second portion, said temperature compensating resistance being free from strain when said strain measuring resistance is strained by flexure of said first portion under the influence of an accelerative force.

* * * * *